United States Patent
Sasaki

(10) Patent No.: US 10,068,796 B2
(45) Date of Patent: Sep. 4, 2018

(54) SEMICONDUCTOR DEVICE MANUFACTURING METHOD

(71) Applicant: TOSHIBA MEMORY CORPORATION, Minato-ku, Tokyo (JP)

(72) Inventor: Toshiyuki Sasaki, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/449,712

(22) Filed: Mar. 3, 2017

(65) Prior Publication Data

US 2018/0090369 A1    Mar. 29, 2018

(30) Foreign Application Priority Data

Sep. 23, 2016   (JP) ................. 2016-186005

(51) Int. Cl.

| | | |
|---|---|---|
| H01L 21/311 | (2006.01) | |
| H01L 21/302 | (2006.01) | |
| H01L 21/461 | (2006.01) | |
| H01B 13/00 | (2006.01) | |
| B44C 1/22 | (2006.01) | |
| C23F 1/00 | (2006.01) | |
| C23F 3/00 | (2006.01) | |
| H01L 21/768 | (2006.01) | |
| H01L 21/027 | (2006.01) | |
| H01L 21/033 | (2006.01) | |
| H01L 21/02 | (2006.01) | |
| H01L 21/308 | (2006.01) | |

(52) U.S. Cl.
CPC ...... *H01L 21/76808* (2013.01); *H01L 21/027* (2013.01); *H01L 21/0268* (2013.01); *H01L 21/0332* (2013.01); *H01L 21/308* (2013.01); *H01L 21/31144* (2013.01); *H01L 21/76813* (2013.01); *H01L 2221/1026* (2013.01); *H01L 2221/1031* (2013.01); *H01L 2221/1036* (2013.01)

(58) Field of Classification Search
None
See application file for complete search history.

(56) References Cited

U.S. PATENT DOCUMENTS

| | | |
|---|---|---|
| 7,982,261 B2 | 7/2011 | Kidoh et al. |
| 8,409,977 B2 | 4/2013 | Shim et al. |
| 9,824,966 B1 * | 11/2017 | Kanakamedala ... H01L 23/5226 |

(Continued)

*Primary Examiner* — Stephanie P. Duclair
(74) *Attorney, Agent, or Firm* — Foley & Lardner LLP

(57) ABSTRACT

A semiconductor device manufacturing method includes forming a first hole in a first processed layer. A first sacrificial film is formed in the first hole. A hole portion is formed in the first sacrificial film. A second sacrificial film is formed in the hole portion. A second processed layer is formed above the first sacrificial film and the second sacrificial film, and a second hole is formed in the second processed layer to expose the second sacrificial film. A third sacrificial film is formed on an inner side surface of the second hole, and a fourth sacrificial film is formed on the third sacrificial film. The second sacrificial film is etched using the fourth sacrificial film as a mask. The third sacrificial film exposed by etching the second sacrificial film is etched. The second processed layer is etched using the third sacrificial film as a mask.

10 Claims, 11 Drawing Sheets

(56) References Cited

U.S. PATENT DOCUMENTS

2011/0065270 A1* 3/2011 Shim ................. H01L 27/11556
                                                    438/589
2014/0284687 A1   9/2014 Murakami

* cited by examiner

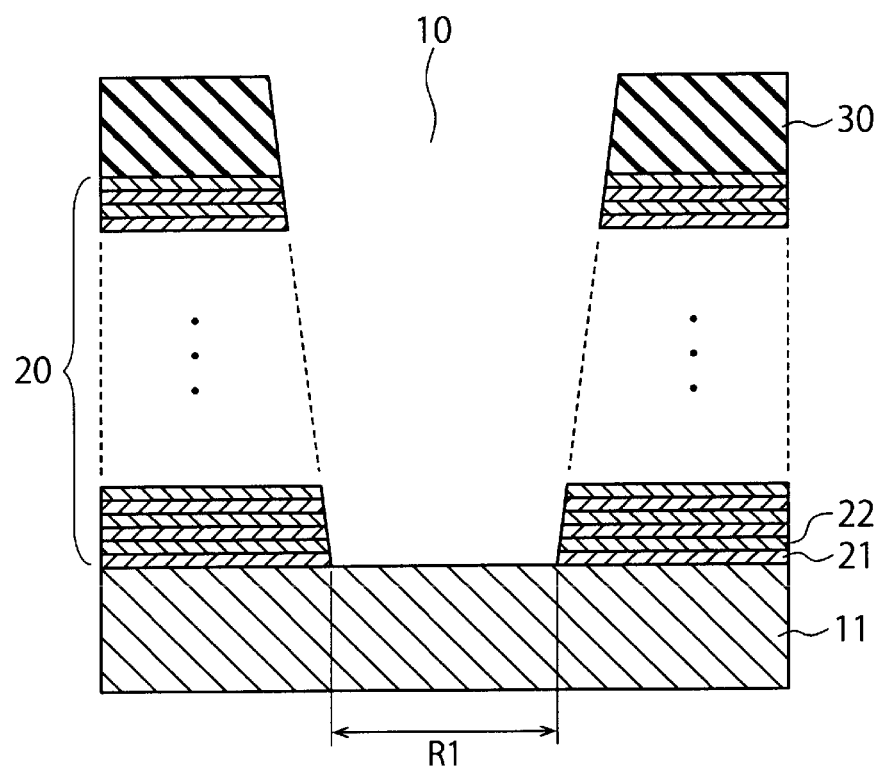

US 10,068,796 B2

SEMICONDUCTOR DEVICE MANUFACTURING METHOD

This application claims the benefit of and priority to Japanese Patent Application No. 2016-186005, filed Sep. 23, 2016, the entire contents of which are incorporated herein by reference.

FIELD

Embodiments described herein relate generally to a semiconductor device manufacturing method.

BACKGROUND

A stacked memory is an example of semiconductor devices. In manufacturing a stacked memory, a memory hole on a lower layer side is often processed separately from a memory hole on an upper layer side as the number of stacked memory cells increases. In this case, when a central axis of the memory hole on the lower layer side is misaligned with respect to a central axis of the memory hole on the upper layer side, there possibly occurs a manufacturing defect such as damage to a channel film and the like formed on an inner side surface of the memory hole on the lower layer side in a step after processing the memory holes.

DESCRIPTION OF THE DRAWINGS

FIG. 1 is a cross-sectional view illustrating a step of manufacturing a semiconductor device according to some embodiments.

DETAILED DESCRIPTION

Figure 2A:
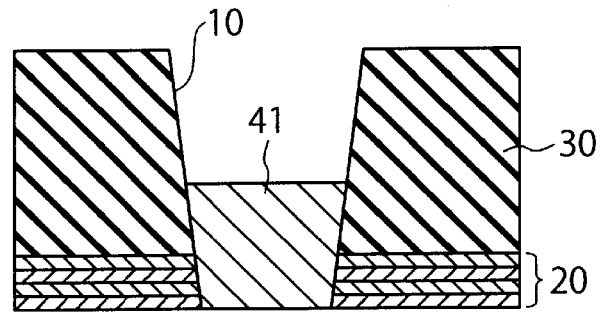
FIG. 2A, FIG. 2B, and FIG. 2C are cross-sectional views illustrating manufacturing steps after the manufacturing step shown in FIG. 1.

An example embodiment provides a semiconductor device manufacturing method capable of avoiding a manufacturing defect resulting from a hole processing defect.

According to some embodiments, a semiconductor device manufacturing method may include forming a first hole in a first processed layer, and forming a first sacrificial film in the first hole. According to some embodiments, the semiconductor device manufacturing method also may include forming a hole portion in the first sacrificial film, and forming a second sacrificial film in the hole portion. According to some embodiments, the semiconductor device manufacturing method further may include forming a second processed layer above the first sacrificial film and the second sacrificial film, and forming a second hole in the second processed layer in such a manner as to expose the second sacrificial film. According to some embodiments, the semiconductor device manufacturing method may include forming a third sacrificial film on an inner side surface of the second hole, and forming a fourth sacrificial film on the third sacrificial film. According to some embodiments, the semiconductor device manufacturing method may include etching the second sacrificial film using the fourth sacrificial film as a mask, etching the third sacrificial film exposed by etching the second sacrificial film, and etching the second processed layer using the third sacrificial film as a mask.

Embodiments of the present disclosure will be described hereinafter with reference to the drawings. The embodiments described hereinafter are not intended to limit the present disclosure.

FIG. 1 to FIG. 11 are cross-sectional views illustrating steps of manufacturing a semiconductor device according to some embodiments. A method of manufacturing a memory (e.g., a nonvolatile memory) having a stacked structure will be described herein.

In some embodiments, as shown in FIG. 1, a first memory hole 10 is formed in such a manner as to penetrate a stacked body 20 that includes first films 21 and second films 22, and a third film 30. In some embodiments, the stacked body 20 is formed on a substrate 11. In some embodiments, various interconnects and elements (not shown) are formed on the substrate 11.

In some embodiments, in the stacked body 20, the first films 21 are formed using, for example, silicon oxide ($SiO_2$). The second films 22 are formed using, for example, silicon nitride (SiN). In some embodiments, the first films 21 and the second films 22 are alternately stacked. In some embodiments, the first films 21 and the second films 22 are alternately stacked using, for example, a CVD (Chemical Vapor Deposition) method. In some embodiments, the third film 30 is provided on an upper surface of the stacked body 20. FIG. 2A to FIG. 6B, to be described below, show an upper layer side of the stacked body 20 and do not show a lower layer side thereof. The third film 30 is formed using, for example, silicon oxide.

In some embodiments, after the first memory hole 10 is formed, a first sacrificial film 41 is buried in the first memory hole 10 as shown in FIG. 2A. At this time, in some embodiments, an upper surface of the first sacrificial film 41 is located above the upper surface of the stacked body 20 in order to protect the stacked body 20 in an etching step shown in FIG. 2B. The first sacrificial film 41 is formed using, for example, amorphous silicon.

Figure 2B:
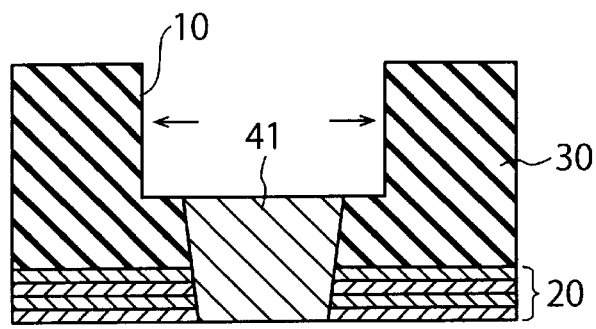

Next, in some embodiments as shown in FIG. 2B, the third film 30 is isotropically wet-etched using the first sacrificial film 41 as a mask. In some embodiments, a diameter of the first memory hole 10 formed in the third film 30 is thereby increased (see arrows in FIG. 2B).

Figure 2C:
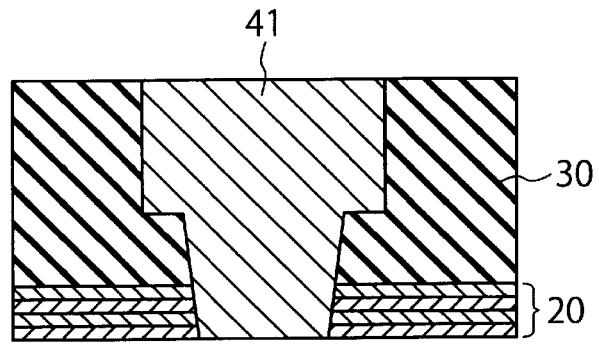

Subsequently, In some embodiments as shown in FIG. 2C, the first sacrificial film 41 is formed in the first memory hole 10 enlarged in the etching step of FIG. 2B using, for example, the CVD method or a CMP (Chemical Mechanical Polishing) method.

Figure 3A:
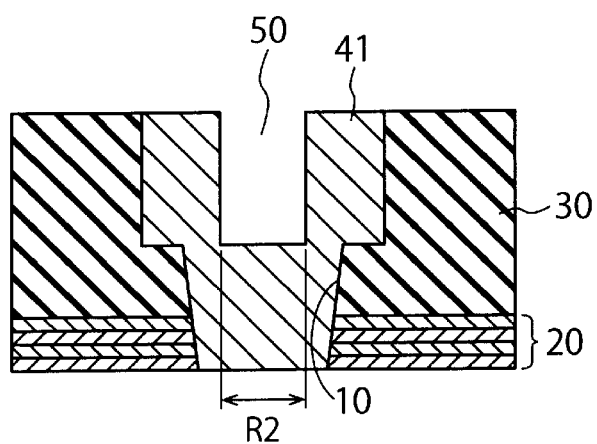
FIG. 3A and FIG. 3B are cross-sectional views illustrating manufacturing steps after the manufacturing step shown in FIG. 2C.

In some embodiments, after the first sacrificial film 41 is formed, a hole portion 50 is formed in the first sacrificial film 41 using, for example, an RIE (Reactive Ion Etching) method as shown in FIG. 3A. In some embodiments, the hole portion 50 is open on an upper surface side of the first sacrificial film 41 and substantially coaxial with the first memory hole 10. In some embodiments, it is preferable that a diameter R2 of the hole portion 50 is equal to or smaller than a diameter R1 (see FIG. 1) of a bottom portion of the first memory hole 10 to address the misalignment between a central axis of the first memory hole 10 and a central axis of a second memory hole 70 to be described later.

Figure 3B:
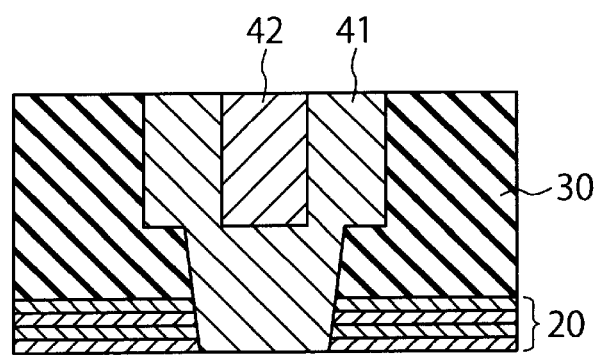

In some embodiments as shown in FIG. 3B, a second sacrificial film 42 is then buried in the hole portion 50 using, for example, the CVD method or the CMP method. In some embodiments, the second sacrificial film 42 is, for example, a cylindrical carbon-containing organic film.

Figure 4A:
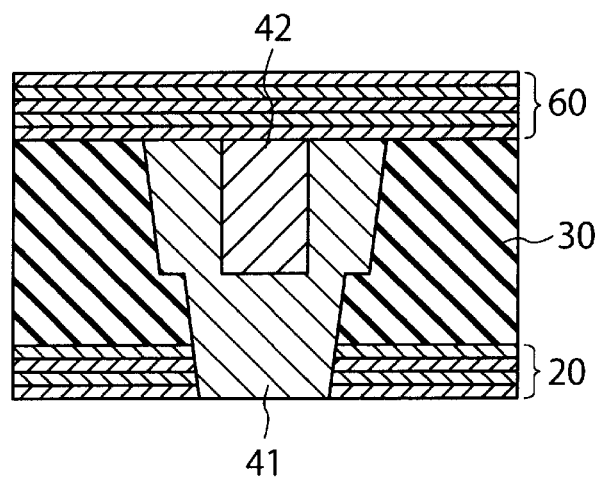
FIG. 4A and FIG. 4B are cross-sectional views illustrating manufacturing steps after the manufacturing step shown in FIG. 3B.

In some embodiments, after the second sacrificial film 42 is formed, a stacked body 60 is formed on the third film 30, the first sacrificial film 41, and the second sacrificial film 42 as shown in FIG. 4A. In some embodiments, similarly to the stacked body 20, the stacked body 60 is formed by alternately stacking the first films 21 and the second films 22 using, for example, the CVD method.

Figure 4B:
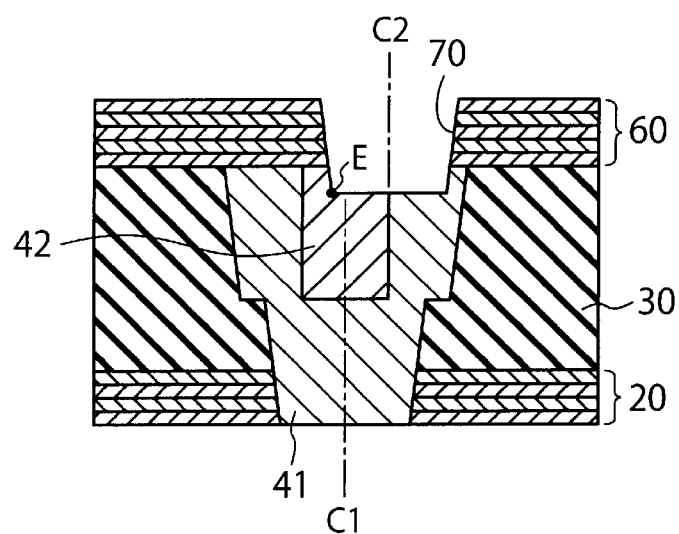

In some embodiments as shown in FIG. 4B, the second memory hole 70 is then formed using, for example, a lithography method or the RIE method. In some embodiments, the second memory hole 70 is formed in such a manner as to penetrate the stacked body 60 to expose the second sacrificial film 42. In some embodiments, a central axis C2 of the second memory hole 70 is aligned with a central axis C1 of the first memory hole 10. In some embodiments as shown in FIG. 4B, the central axis C2 may be misaligned with respect to the central axis C1. In some embodiments as shown in FIG. 4B, one end E of a bottom portion of the second memory hole 70 is located on the second sacrificial film 42.

Figure 5A:
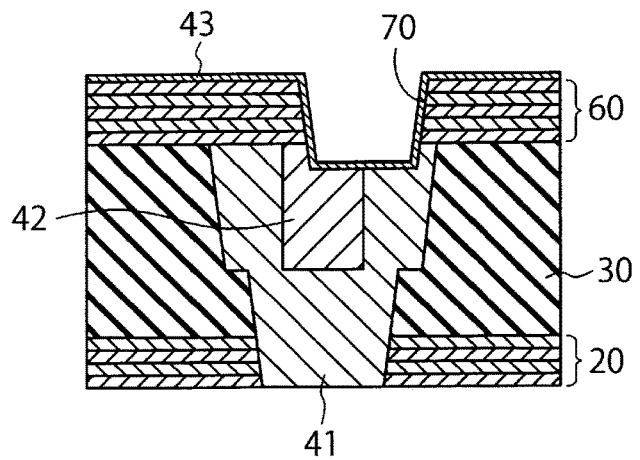
FIG. 5A, FIG. 5B, and FIG. 5C are cross-sectional views illustrating manufacturing steps after the manufacturing step shown in FIG. 4B.

In some embodiments, after the second memory hole 70 is formed, a third sacrificial film 43 is formed as shown in FIG. 5A. In some embodiments, the third sacrificial film 43 is formed on an inner side surface and a bottom surface of the second memory hole 70 and an upper surface of the stacked body 60. In some embodiments, the third sacrificial film 43 is formed using the same material as that for the second sacrificial film 42 because the third sacrificial film 43 as well as the second sacrificial film 42 is etched in a later step. In some embodiments, the third sacrificial film 43 is an organic film formed using, for example, the CVD method.

Figure 5B:
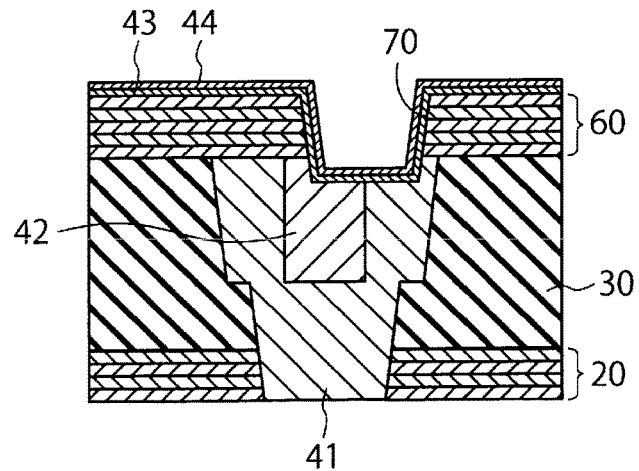

In some embodiments as shown in FIG. 5B, a fourth sacrificial film 44 is then formed on the third sacrificial film 43. In some embodiments, the fourth sacrificial film 44 is formed using amorphous silicon deposited by, for example, the CVD method. In some embodiments, the third sacrificial film 43 is formed at a uniform thickness in the second memory hole 70. In some embodiments, the fourth sacrificial film 44 is formed at a uniform thickness in the second memory hole 70.

Figure 5C:
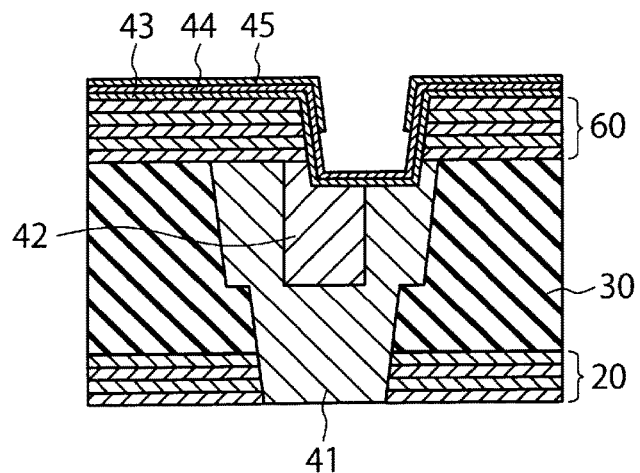

Subsequently, in some embodiments as shown in FIG. 5C, a fifth sacrificial film 45 is formed. In some embodiments, the fifth sacrificial film 45 is stacked on the fourth sacrificial film 44 from the upper surface of the stacked body 60 to an upper portion of the inner side surface of the second memory hole 70. In some embodiments, the fifth sacrificial film 45 is formed using amorphous silicon deposited by, for example, a sputtering method. In some embodiments, the fourth sacrificial film 44 and the fifth sacrificial film 45 may contribute to forming a thick amorphous silicon film on the upper portion of the inner side surface of the second memory hole 70. In some embodiments, an amorphous silicon film thinner than the amorphous silicon film formed on the upper portion may be formed on a lower portion of the inner side surface and the bottom surface of the second memory hole 70.

Figure 6A:
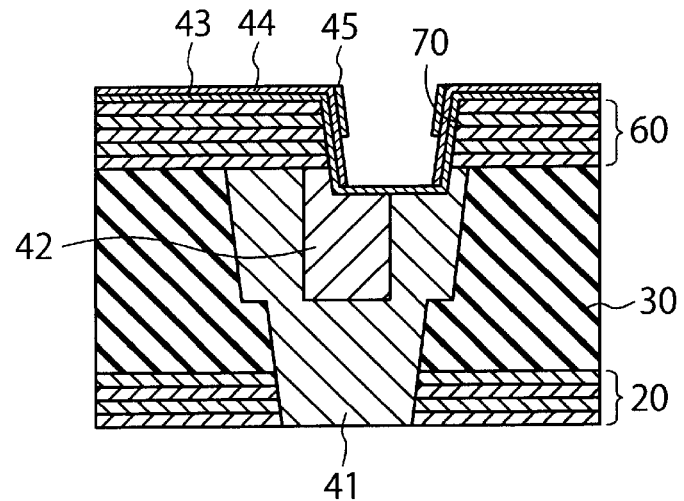
FIG. 6A and FIG. 6B are cross-sectional views illustrating manufacturing steps after the manufacturing step shown in FIG. 5C.

In some embodiments as shown in FIG. 6A, the fourth sacrificial film 44 formed on the bottom portion of the second memory hole 70 is etched using the fifth sacrificial film 45 as a mask. In some embodiments, the fourth sacrificial film is etched by, for example, the RIE method using fluorine-containing gas.

Figure 6B:
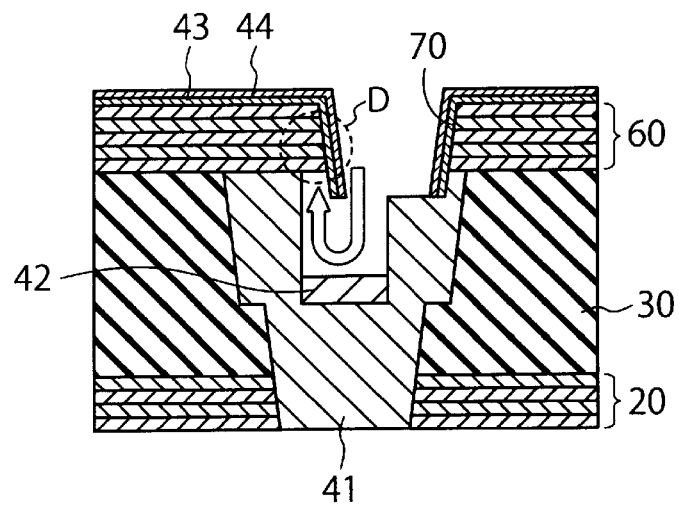

In some embodiments as shown in FIG. 6B, the third sacrificial film 43 formed on the bottom portion of the second memory hole 70 is etched using the fourth sacrificial film 44 as a mask. In some embodiments, this third sacrificial film 43 is isotropically etched using, for example, oxygen gas. At this time, in some embodiments, the second sacrificial film formed of the same material as that for this third sacrificial film 43 is also etched. In some embodiments, the oxygen gas thereby recirculates into a back side of the third sacrificial film 43 (see an arrow in FIG. 6B) to remove a contact portion between the second sacrificial film 42 and the third sacrificial film 43. As a result, in some embodiments, a lower portion of the third sacrificial film 43 and a lower portion of the stacked body 60 are exposed (see a region D in FIG. 6B).

In some embodiments, when the first films 21 are silicon oxide films and the second films 22 are silicon nitride films, the first films 21 and the second films 22 are hardly etched by the etching using the oxygen gas. In some embodiments, owing to this, the etching of the third sacrificial film 43 selectively proceeds in a direction from the lower portion to the upper portion of the second memory hole 70.

Figure 7A:
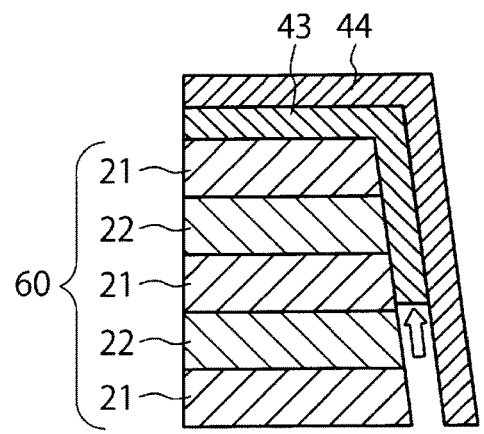
FIG. 7A, FIG. 7B, and FIG. 7C are cross-sectional views illustrating manufacturing steps after the manufacturing step shown in FIG. 6B.

In some embodiments as shown in FIG. 7A, when, for example, a side surface of the first film 21 which is a lowermost layer in the stacked body 60 and a side surface of the second film 22 in contact with the first film 21 are exposed, the etching of the third sacrificial film 43 is stopped.

Figure 7B:
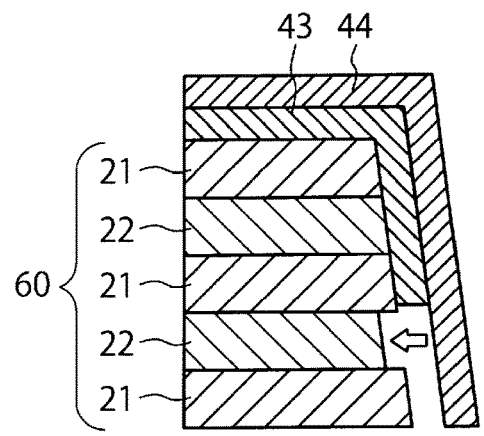

Subsequently, in some embodiments as shown in FIG. 7B, the abovementioned first film 21 and the abovementioned second film 22 are isotropically etched using, for example, buffered HF (BHF). In some embodiments, a diameter of the bottom portion of the second memory hole 70 (see FIG. 6B) is thereby increased (see an arrow in FIG. 7B).

In some embodiments, the diameter of the second memory hole 70 is uniform from the upper portion to the bottom portion. In some embodiments, when an aspect ratio (e.g., ratio of a depth to the diameter) of the second memory hole 70 increases, the second memory hole 70 tends to have a tapered shape toward the bottom portion.

Figure 7C:
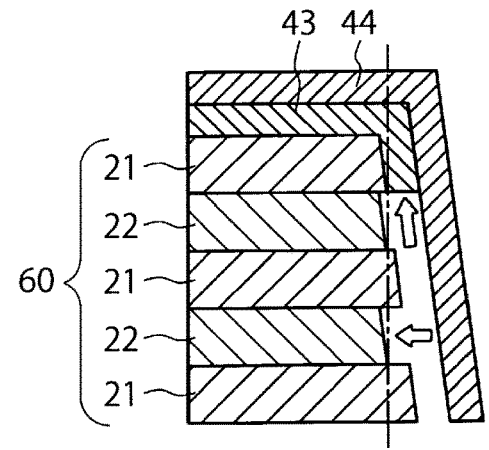

Considering the above, in some embodiments as shown in FIG. 7C, an etching step of etching the third sacrificial film 43 and an etching step of etching the stacked body 60 are repeated, thereby allowing the etching of the stacked body 60 to proceed step by step from the bottom portion, where the diameter is smaller, of the second memory hole 70. In this manner, in some embodiments, the diameter of the second memory hole 70 is increased step by step from the bottom portion, so that the inner side surface of the second memory hole 70 becomes closer to a surface parallel to a stacking direction (e.g., an axial direction of the second memory hole 70). The tapered shape can be thereby improved.

Figure 8:
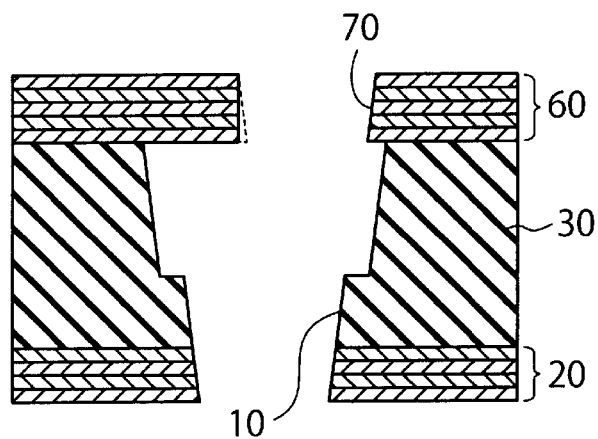
FIG. 8 is a cross-sectional view illustrating a manufacturing step after the manufacturing step shown in FIG. 7C.

In some embodiments as shown in FIG. 8, the first sacrificial film 41 and the third sacrificial film 43 to the fifth sacrificial film 45 are removed. In some embodiments, when the first sacrificial film 41, the fourth sacrificial film 44, and the fifth sacrificial film 45 are amorphous silicon films, the respective sacrificial films 41, 44, and 45 may be removed using, for example, tetramethylammonium hydroxide (TMA). In some embodiments, when the third sacrificial film 43 is an organic film, the third sacrificial film 43 may be removed using, for example, an ashing method. In some embodiments, the diameter of the second memory hole 70 exposed by removal of the respective sacrificial films 41 and 43 to 45 is increased in a direction (e.g., a direction D in FIG. 10) opposite to a direction of the misalignment of the central axis C2.

Figure 9A:
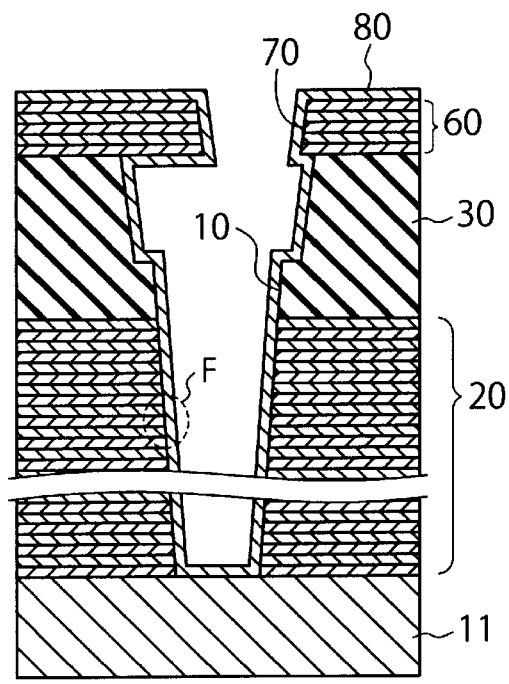
FIG. 9A and FIG. 9B are cross-sectional views illustrating manufacturing steps after the manufacturing step shown in FIG. 8.
Figure 9B:
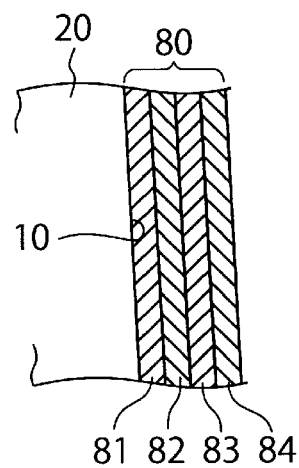

Subsequently, in some embodiments as shown in FIG. 9A, a stacked film 80 is formed in the first memory hole 10 and the second memory hole 70 using, for example, the CVD method. FIG. 9B is an enlarged view of a region F shown in FIG. 9A. In some embodiments as shown in FIG. 9B, the stacked film 80 includes a block insulating film 81, a charge storage layer 82, a tunnel oxide film 83, and a channel film 84.

In some embodiments, the block insulating film 81 is formed using, for example, silicon oxide and comes in contact with the first memory hole 10 and the second memory hole 70. In some embodiments, the charge storage layer 82 is formed on the block insulating film 81, using, for example, silicon nitride. In some embodiments, the tunnel oxide film 83 is formed on the charge storage layer 82, using, for example, silicon oxide. In some embodiments, the channel film 84 is formed on the tunnel oxide film 83, using, for example, amorphous silicon.

Figure 10:
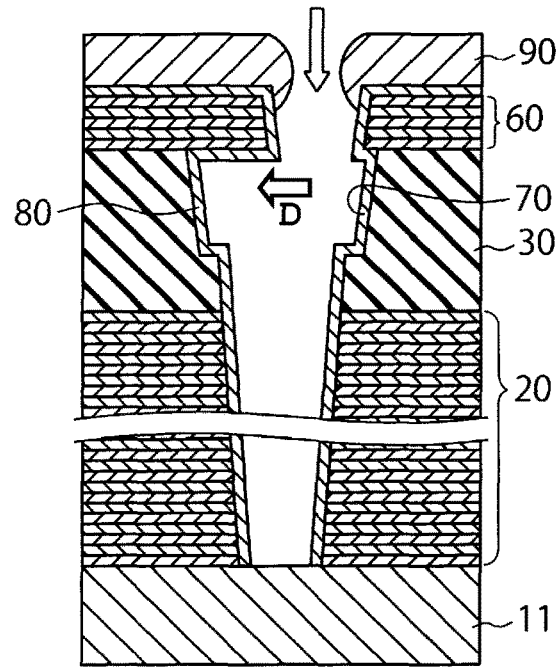
FIG. 10 is a cross-sectional view illustrating a manufacturing step after the manufacturing step shown in FIG. 9B.

Subsequently, in some embodiments as shown in FIG. 10, an organic film 90 is formed on the upper surface of the stacked body 60 and the upper portion of the second memory hole 70, and the stacked film 80 provided on the bottom portion of the first memory hole 10 is etched using this organic film 90 as a mask. In some embodiments, this stacked film 80 is etched using, for example, the RIE method.

Assuming that the second sacrificial film 42 and the third sacrificial film 43 are not present, the diameter of the second memory hole 70 is not corrected. Owing to this, there is a case where, after formation of the stacked film 80, in a view from above the second memory hole 70, the bottom portion of the first memory hole 10 to be etched is invisible due to the tapered shape of the inner side surface of the first memory hole 10 while the inner side surface of the first memory hole 10 which is not to be etched is visible. In this case, the stacked film 80 provided on this inner side surface is possibly damaged by, for example, the RIE method.

However, in some embodiments, the third sacrificial film 43 is selectively etched in the opposite direction (e.g., a direction D from the right side to the left side in FIG. 10) to the direction of the misalignment of the central axis C2 (see FIG. 4B) of the second memory hole 70 in the steps shown in FIG. 7A, FIG. 7B, and FIG. 7C described above, so that it is possible to etch the stacked film 80 from the opposite direction. In other words, the diameter of the second memory hole 70 is corrected such that the bottom portion of the first memory hole 10 is visible in the view from above the second memory hole 70.

Figure 11:
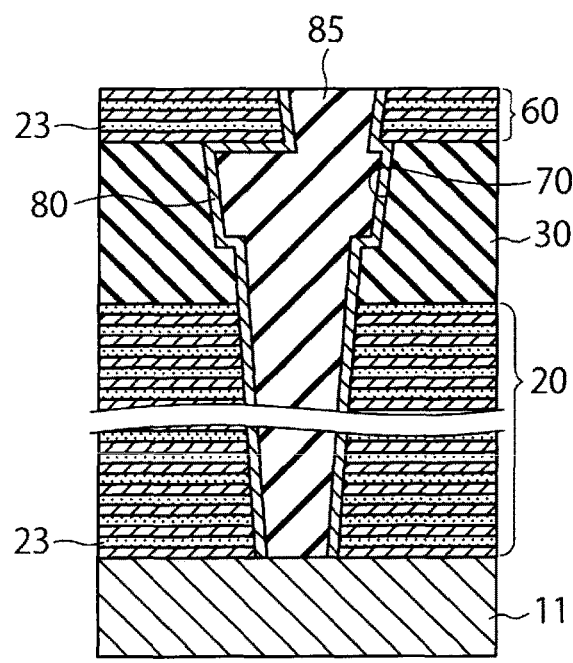
FIG. 11 is a cross-sectional view illustrating a manufacturing step after the manufacturing step shown in FIG. 10.

In some embodiments, after the stacked film 80 is etched, the substrate 11 is made conductive with the channel film 84 by, for example, epitaxial growth. In some embodiments as shown in FIG. 11, a core layer 85 is buried in the first memory hole 10 and the second memory hole 70. The core layer 85 is formed using, for example, silicon nitride.

In some embodiments, after the core layer 85 is buried, a slit (not shown) penetrating the stacked body 20, the third film 30, and the stacked body 60 may be formed separately from the first memory hole 10 and the second memory hole 70. Subsequently, in some embodiments, the second films 22 are each replaced by an electrode film 23 (see FIG. 11) using this slit. Subsequently, in some embodiments, an interlayer insulating film (not shown), interconnects (not shown), and the like may be formed, thereby completing the nonvolatile memory.

According to some embodiments, the hole diameter of the second memory hole 70 is corrected using the second sacrificial film 42, the third sacrificial film 43, and the like in such a manner that the central axis C2 (see FIG. 4B) of the second memory hole 70 is closer to the central axis C1 (see FIG. 4B) of the first memory hole 10. It is thereby possible to avoid damage to the stacked film 80 formed on the inner side surface of the first memory hole 10 even if a memory hole processing defect such as the misalignment of the central axis C2 of the second memory hole 70 occurs.

Furthermore, in some embodiments, when the diameter of the second memory hole 70 excessively increases, the stacked film 80 formed on the inner side surface of the first memory hole 10 is often visible in the view from above the second memory hole 70. To address the problem, in some embodiments, the diameter R2 (see FIG. 3A) of the hole portion 50 formed in the first sacrificial film 41 is equal to or smaller than the diameter R1 of the bottom portion of the first memory hole 10, thereby making the diameter of the second memory hole 70 minimal. It is thereby possible to avoid the damage to the stacked film 80 resulting from the increase in the diameter of the second memory hole 70.

Manufacturing steps according to some embodiments when another processing defect occurs to the second memory hole 70 will be described below with reference to FIG. 12A, FIG. 12B, FIG. 12C, and FIG. 12D.

Figure 12A:
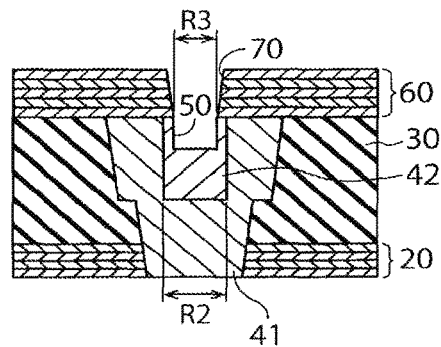
FIG. 12A, FIG. 12B, FIG. 12C, and FIG. 12D are cross-sectional views illustrating manufacturing steps when another processing defect occurs to a second memory hole.
Figure 12B:
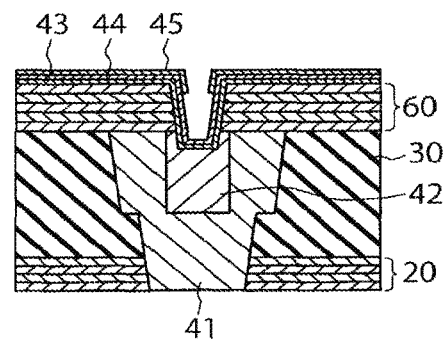
Figure 12C:
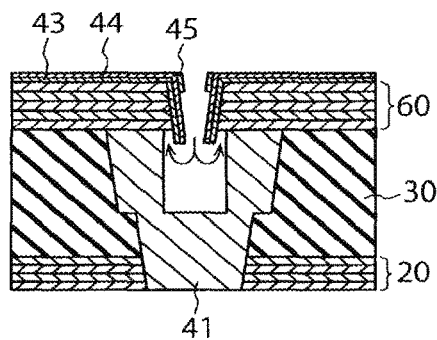
Figure 12D:
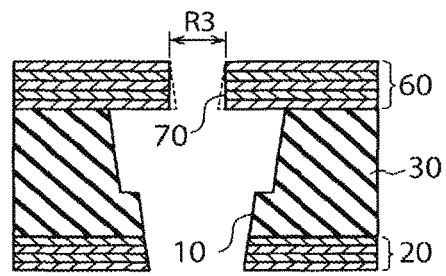

FIG. 12A shows a processing defect that a diameter R3 of the bottom portion of the second memory hole 70 is smaller than the diameter R2 of the hole portion 50 (e.g., diameter of the second sacrificial film 42). In some embodiments as shown in FIG. 12A, the bottom portion of the second memory hole 70 is located inside the second sacrificial film 42. Even in this case, in some embodiments, the third sacrificial film 43, the fourth sacrificial film 44, and the fifth sacrificial film 45 are formed, as shown in FIG. 12B. Subsequently, in some embodiments, the second sacrificial film 42 is etched, and the third sacrificial film 43 and the stacked body 60 are etched from the lower portion of the second memory hole 70, as shown in FIG. 12C. As a result, in some embodiments as shown in FIG. 12D, the diameter R3 of the bottom portion of the second memory hole 70 is increased, so that it is possible to sufficiently expose the bottom portion of the first memory hole 10 in the view from above the second memory hole 70. It is thereby possible to increase the diameter of the second memory hole 70 even when the processing defect that the diameter thereof is small occurs.

In some embodiments, the stacked body 20 may be used as a first processed layer where the first memory hole 10 is to be processed and the stacked body 60 may be used as a second processed layer where the second memory hole 70 is to be processed. In some embodiments, each of this first processed layer and this second processed layer may be a single layer.

In the description of some embodiments, an element provided "on" or "above" another element can encompass cases where the former element is directly on (e.g., in physical contact with) the latter element, as well as cases where one or more intervening elements are located between the former element and the latter element.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device manufacturing method comprising:
   forming a first hole in a first processed layer;
   forming a first sacrificial film in the first hole;
   forming a hole portion in the first sacrificial film;
   forming a second sacrificial film in the hole portion;
   forming a second processed layer above the first sacrificial film and the second sacrificial film;
   forming a second hole in the second processed layer to expose the second sacrificial film;
   forming a third sacrificial film on an inner side surface of the second hole;
   forming a fourth sacrificial film on the third sacrificial film;
   etching the second sacrificial film using the fourth sacrificial film as a mask, and etching the third sacrificial film exposed by etching the second sacrificial film; and
   etching the second processed layer using the third sacrificial film as a mask.

2. The semiconductor device manufacturing method according to claim 1, further comprising:
   forming the first processed layer as a stacked body by alternately stacking first films and second films,
   wherein forming the first hole includes forming the first hole in a third film formed on the first processed layer when the first hole is formed in the first processed layer.

3. The semiconductor device manufacturing method according to claim 2, wherein
   the first films are formed using silicon oxide, and the second films are formed using silicon nitride.

4. The semiconductor device manufacturing method according to claim 1,
   wherein a diameter of the hole portion is equal to or smaller than a diameter of a bottom portion of the first hole.

5. The semiconductor device manufacturing method according to claim 1,
   wherein the second sacrificial film and the third sacrificial film are formed of a same material.

6. The semiconductor device manufacturing method according to claim 5,
   wherein an organic film is used for each of the second sacrificial film and the third sacrificial film.

7. The semiconductor device manufacturing method according to claim 1, further comprising:
   alternatively repeating the etching of the second sacrificial film and the third sacrificial film and the etching of the second processed layer.

8. The semiconductor device manufacturing method according to claim 1, wherein
   the first sacrificial film is formed using amorphous silicon.

9. The semiconductor device manufacturing method according to claim 1,
   wherein forming the second processed layer includes forming the second processed layer as a stacked body by alternately stacking first films and second films.

10. The semiconductor device manufacturing method according to claim 9, wherein the first films are formed using silicon oxide, and the second films are formed using silicon nitride.

* * * * *